United States Patent
Nagayoshi et al.

(10) Patent No.: US 6,557,155 B2
(45) Date of Patent: Apr. 29, 2003

(54) LAYOUT DESIGN METHOD

(75) Inventors: Futoshi Nagayoshi, Kanagawa (JP); Shoichiro Sato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 115 days.

(21) Appl. No.: 09/768,594

(22) Filed: Jan. 25, 2001

(65) Prior Publication Data

US 2001/0010093 A1 Jul. 26, 2001

(30) Foreign Application Priority Data

Jan. 25, 2000 (JP) ........................................ 2000-015985

(51) Int. Cl.[7] ........................ G06F 17/50; H01L 27/10
(52) U.S. Cl. .......................... 716/14; 716/11; 257/206
(58) Field of Search .............................. 716/14; 257/206

(56) References Cited

U.S. PATENT DOCUMENTS

| | | | | |
|---|---|---|---|---|
| 4,745,084 A | * | 5/1988 | Rowson et al. | 257/206 |
| 5,010,501 A | * | 4/1991 | Arakawa | 345/420 |
| 5,627,999 A | * | 5/1997 | Cheng et al. | 716/8 |
| 5,638,291 A | * | 6/1997 | Li et al. | 714/700 |
| 5,666,288 A | * | 9/1997 | Jones et al. | 716/17 |
| 5,936,869 A | * | 8/1999 | Sakaguchi et al. | 345/423 |
| 5,959,311 A | * | 9/1999 | Shih et al. | 257/355 |
| 6,005,409 A | * | 12/1999 | Bui et al. | 324/765 |
| 6,266,062 B1 | * | 7/2001 | Rivara | 345/419 |
| 6,292,927 B1 | * | 9/2001 | Gopisetty et al. | 716/11 |

FOREIGN PATENT DOCUMENTS

| | | |
|---|---|---|
| JP | 06-204467 | 7/1994 |
| JP | 11-297836 | 10/1999 |

* cited by examiner

*Primary Examiner*—Matthew Smith
*Assistant Examiner*—Andrea Liu
(74) *Attorney, Agent, or Firm*—Young & Thompson

(57) ABSTRACT

A method for designing routes for multilevel interconnections in a semiconductor device having at least a field effect transistor having a gate electrode, where the route extends between a diffusion region and the gate electrode. Each interconnection connected to the gate electrode is given an area which does not exceed a predetermined antenna effect reference value by inserting a buffer, such as a logic gate, into the interconnection on the same level as the interconnection.

10 Claims, 20 Drawing Sheets

LAYOUT DESIGN METHOD

BACKGROUND OF THE INVENTION

The present invention relates to a layout design method, and more particularly to a layout design method for a semiconductor device having a multilevel interconnection structure using metal interconnections.

In processes for forming metal interconnections such as aluminum interconnections for a semiconductor device, a plasma etching technique has widely been used for patterning an interconnection layer. In the plasma etching process, charges are generated in the interconnection. FIG. 1 is a fragmentary circuit diagram illustrative of a route extending between first and second inverters to explain an antenna effect. FIG. 2 is a fragmentary cross sectional elevation view illustrative of a first type route extending between first and second inverters in a semiconductor substrate to explain an antenna effect. FIG. 3 is a fragmentary cross sectional elevation view illustrative of a second type route extending between first and second inverters in a semiconductor substrate to explain an antenna effect.

With reference to FIG. 1, a route 50 extends between a first inverter 51 and a second inverter 52. The first inverter 51 comprises a series connection of a first p-channel MOS field effect transistor PMOS1 and a first n-channel MOS field effect transistor NMOS1 between a high voltage line and a ground line. The first inverter 52 comprises a series connection of a second p-channel MOS field effect transistor PMOS2 and a second n-channel MOS field effect transistor NMOS2 between a high voltage line and a ground line.

With reference to FIG. 2, the route 50 comprises an interconnection 111a. The interconnection 111a has a first end connected through a diffusion contact 4 to one of diffusion regions of the first n-channel MOS field effect transistor NMOS1 which is formed in a semiconductor substrate 10. The interconnection 111a has a second end connected through a gate contact 5 to a gate electrode on a gate insulating film of a second n-channel MOS field effect transistor NMOS2 which is formed in the semiconductor substrate 10. If the charges are generated in the interconnection 111a, then the charges are moved through the diffusion contact 4 and the diffusion region 1 to the substrate 10. No charge accumulation thus appears in the interconnection 111a.

With reference to FIG. 3, the route 50 comprises first level interconnections 111b and 111c, and a second level interconnection 121. A first end of the second level interconnection 121 is connected through a first through hole 116a to the first level interconnection 111b. A second end of the second level interconnection 121 is connected through a second through hole 116b to the first level interconnection 111c. The first level interconnection 111b is connected through a diffusion contact 4 to a diffusion region of the first n-channel MOS field effect transistor NMOS1 which is formed in a semiconductor substrate 10. The first level interconnection 111c is connected through a gate contact 5 to a gate electrode on a gate insulating film of a second n-channel MOS field effect transistor NMOS2 which is formed in the semiconductor substrate 10. When the first level interconnections 111b and 111c have just been formed, and the second level interconnection 121 has not yet been formed, the charges generated in the first level interconnection 111b flow through the diffusion contact 4 and the diffusion region 1 to the substrate 10. However, the charges generated in the first level interconnection 111c in the process for patterning the first level interconnection 111c are accumulated in the first level interconnection 111c, because the second level interconnection 121 has not yet been formed and thus the first level interconnection 111c has not yet been connected to the first level interconnection 111b. The first level interconnection 111c having the charge accumulation is, however, connected to the gate electrode 3 of each of the n-channel and p-channel MOS field effect transistors NMOS2 and PMOS2. The charge accumulation in the first level interconnection 111c varies the potential of the gate electrodes of the n-channel and p-channel MOS field effect transistors NMOS2 and PMOS2. If the potential of the gate electrodes of the n-channel and p-channel MOS field effect transistors NMOS2 and PMOS2 exceeds a threshold value which is determined by a thickness of the gate insulating film 2, then a breakdown appears in the gate insulating film 2. This effect is so called to as the antenna effect.

In accordance with the antenna effect, the increase in the amount of the accumulated charges in the gate electrodes 3 of the n-channel and p-channel MOS field effect transistors NMOS2 and PMOS2 increases the likelihood of breakdown of the gate insulating films 2.

FIG. 4 is a fragmentary cross sectional elevation view illustrative of a third type route extending between first and second inverters in a semiconductor substrate to explain an antenna effect. FIG. 5 is a fragmentary cross sectional elevation view illustrative of a fourth type route extending between first and second inverters in a semiconductor substrate to explain an antenna effect. Each of the third type route 50 and the fourth type routes 50 comprises a multilevel interconnection structure, wherein lower level interconnections connected to the gate electrodes are separated from the diffusion regions when the lower level interconnections are patterned by the plasma etching process. The charges are accumulated in the lower level interconnections connected to the gate electrodes but separated from the diffusion regions, whereby the gate potential varies to cause the above-described antenna effect. If the area in plan view of the lower level interconnections connected to the gate electrodes but separated from the diffusion regions is relatively large, a relatively large amount of charge is generated, whereby the antenna effect is remarkable. In order to solve the above problem with the antenna effect, it is effective to reduce the area of the lower level interconnections connected to the gate electrodes but separated from the diffusion regions.

A first conventional method of avoiding the antenna effect is disclosed in Japanese laid-open patent publication No. 11-214521. FIG. 6 is a fragmentary cross sectional elevation view illustrative of a fifth type route extending between first and second inverters in a semiconductor substrate to explain an antenna effect. In a minimum basic cell unit for automatic layout, immediately before gate input, any interconnections in the route are once separated to switch into the top level interconnection, whereby it is unnecessary to correct manually. This conventional method, however, causes the following problems. The disclosed conventional countermeasure to the antenna effect switches the individual basic cells in the automatic layout into the top level interconnection immediately before the input. The individual cells vary in size. The placement and routine may be made by use of the automatic layout tool. FIG. 7 is a diagram illustrative of a routine of interconnections to avoid switched regions in accordance with the conventional countermeasure to the antenna effect, wherein broken line represent interconnection and cross-hatched region represents the switched region in accordance with the conventional countermeasure to the antenna effect. The routine of interconnections are made to avoid the switched regions in accordance with the conventional countermeasure to the antenna effect, whereby the freedom in routine of interconnections is reduced. This further makes it possible to carry out a timing design in layout. Further, the layout area is increased to decrease the degree of integration, whereby the chip size is enlarged, and the cost performance is reduced.

In the above circumstances, it had been required to develop a novel layout design method free from the above problem.

SUMMARY OF THE INVENTION

Accordingly, it is an object of the present invention to provide a novel layout design method free from the above problems.

It is a further object of the present invention to provide a novel layout design method capable of suppressing antenna effect and also preventing reduction in freedom of routine of the interconnections.

It is a still further object of the present invention to provide a novel layout design method capable of making the timing design easy.

It is yet a farther object of the present invention to provide a novel layout design method allowing high density integration.

The present invention provides a layout design method for routine of a route comprising multilevel interconnections in a semiconductor device having at least a field effect transistor having a gate electrode, and the route extending between a diffusion region and the gate electrode, wherein each interconnection being connected to the gate electrode and being not connected to the diffusion region, when the each interconnection is patterned, has an area which does not exceed a predetermined reference value.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

Figure 1:
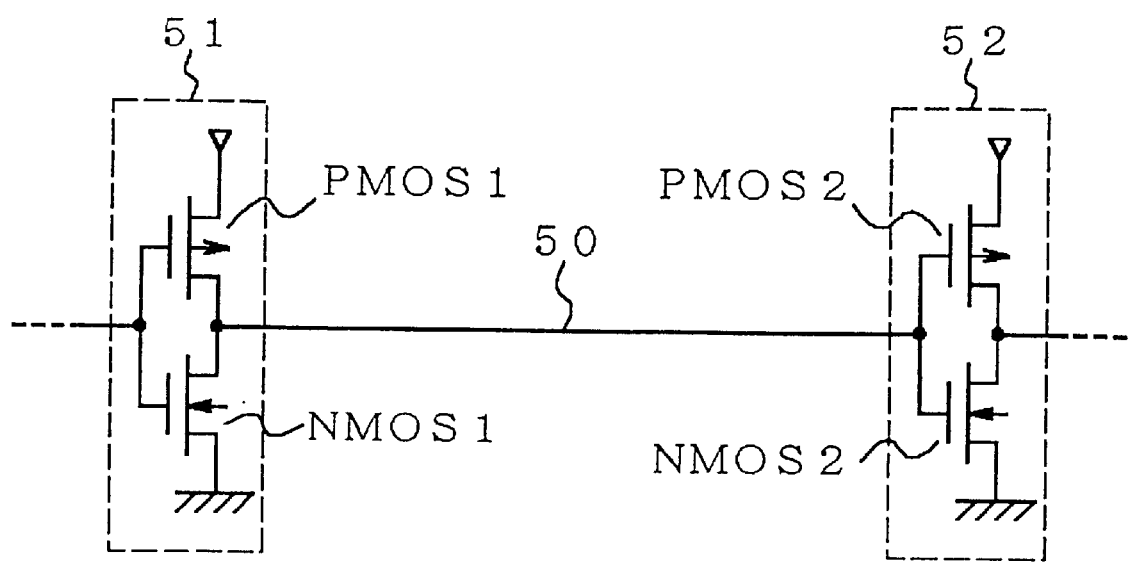
FIG. 1 is a fragmentary circuit diagram illustrative of a route extending between first and second inverters to explain an antenna effect.
Figure 2:
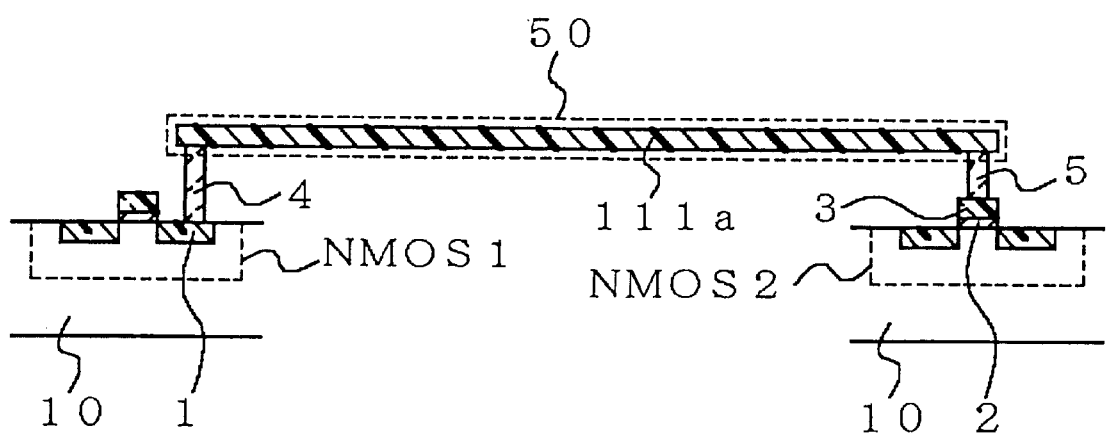
FIG. 2 is a fragmentary cross sectional elevation view illustrative of a first type route extending between first and second inverters in a semiconductor substrate to explain an antenna effect.
Figure 3:
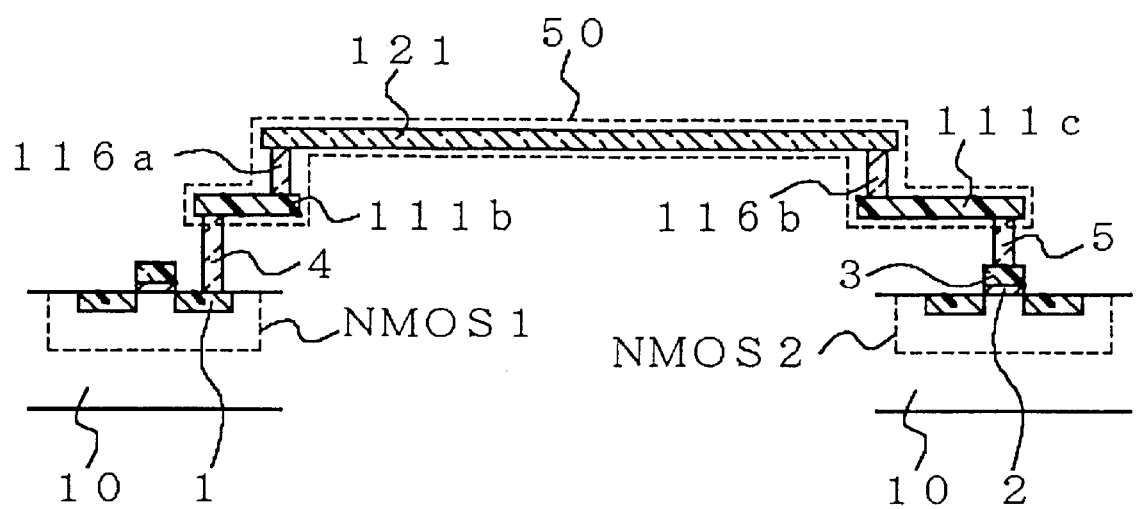
FIG. 3 is a fragmentary cross sectional elevation view illustrative of a second type route extending between first and second inverters in a semiconductor substrate to explain an antenna effect.
Figure 4:
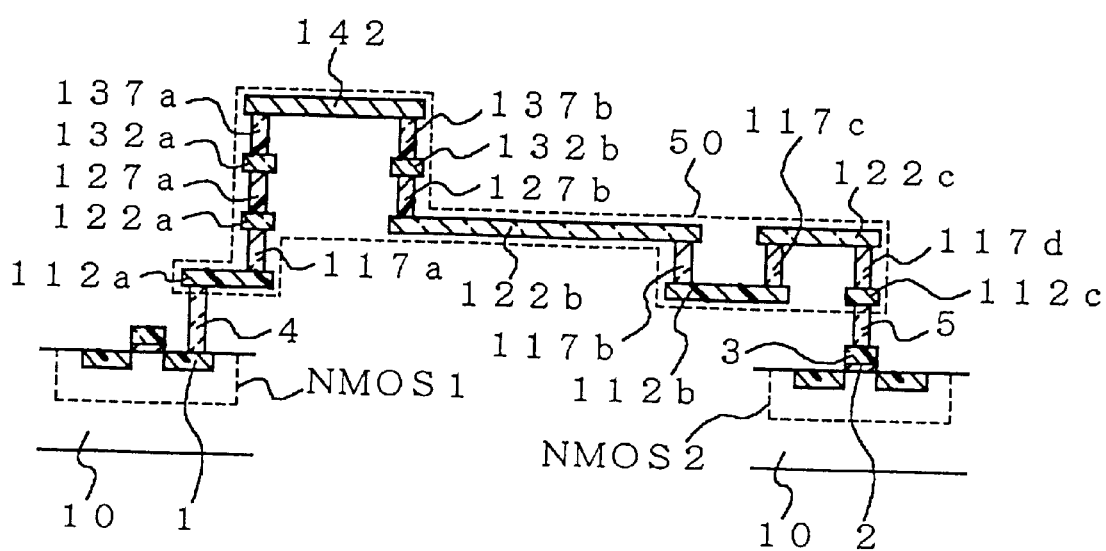
FIG. 4 is a fragmentary cross sectional elevation view illustrative of a third type route extending between first and second inverters in a semiconductor substrate to explain an antenna effect.
Figure 5:
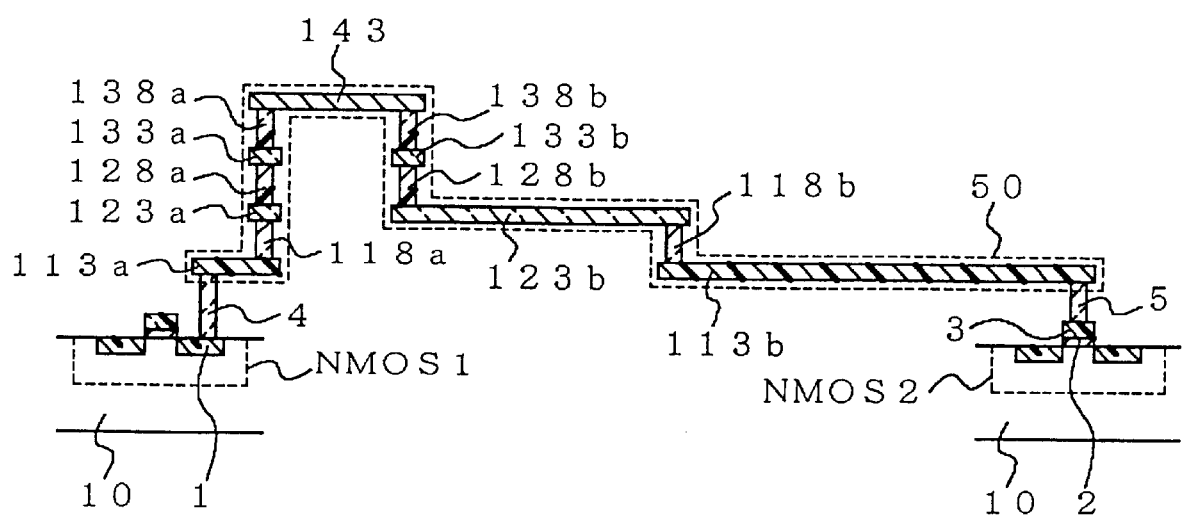
FIG. 5 is a fragmentary cross sectional elevation view illustrative of a fourth type route extending between first and second inverters in a semiconductor substrate to explain an antenna effect.
Figure 6:
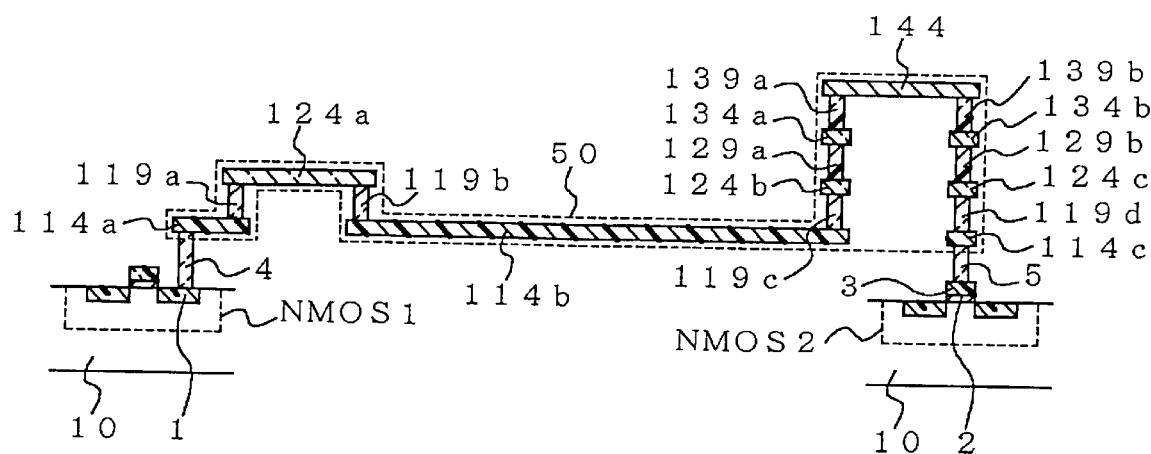
FIG. 6 is a fragmentary cross sectional elevation view illustrative of a fifth type route extending between first and second inverters in a semiconductor substrate to explain an antenna effect.
Figure 7:
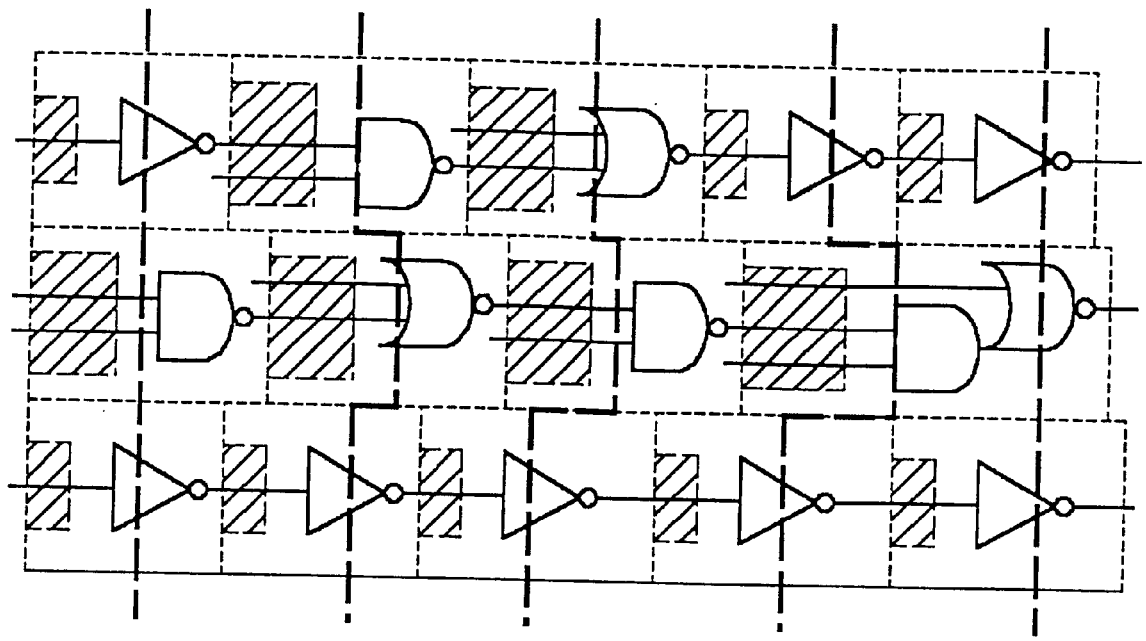
FIG. 7 is a diagram illustrative of a routine of interconnections to avoid switched regions in accordance with the conventional countermeasure to the antenna effect, wherein broken line represent interconnection and cross-hatched region represents the switched region in accordance with the conventional countermeasure to the antenna effect.

The first present invention provides a layout design method for routine of a route comprising multilevel interconnections in a semiconductor device having at least a field effect transistor having a gate electrode, and the route extending between a diffusion region and the gate electrode, wherein each interconnection being connected to the gate electrode and being not connected to the diffusion region, when the each interconnection is patterned, has an area which does not exceed a predetermined reference value.

It is preferable that the layout design method includes an antenna effect suppressing process which further comprising the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is also preferable that the layout design method comprises the step of: executing a placement and routine process; executing an antenna effect suppressing process; executing a timing verification process; and executing a design rule check process, wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is also preferable that the layout design method comprises the step of: selecting one of function blocks constituting the semiconductor device; executing a placement and routine process for the selected function block; executing an antenna effect suppressing process for the selected function block; executing a timing verification process for the selected function block; executing a design rule check process for the selected function block; and repeating the antenna effect suppressing process until it is verified that all of the function blocks have been subjected to the antenna effect suppressing process, and wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is also preferable that the layout design method includes an antenna effect suppressing process which further comprising the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and inserting at least a buffer between the gate-connected one to an adjacent one of plural divided sub-interconnection parts.

It is further preferable that the buffer comprises a logic gate.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is also preferable that the layout design method comprises the step of: executing a placement and routine process; executing an antenna effect suppressing process; executing a timing verification process; and executing a design rule check process, wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and inserting at least a buffer between the gate-connected one to an adjacent one of plural divided sub-interconnection parts.

It is further preferable that the buffer comprises a logic gate.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

The second present invention provides a computer program for a layout design for routine of a route comprising multilevel interconnections in a semiconductor device having at least a field effect transistor having a gate electrode, and the route extending between a diffusion region and the gate electrode, wherein each interconnection being connected to the gate electrode and being not connected to the diffusion region, when the each interconnection is patterned, has an area which does not exceed a predetermined reference value.

It is preferable that the computer program includes an antenna effect suppressing process which further comprising the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is further preferable that the computer program comprises the step of: executing a placement and routine process; executing an antenna effect suppressing process; executing a timing verification process; and executing a design rule check process, wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is further preferable that the computer program comprises the step of: selecting one of function blocks constituting the semiconductor device; executing a placement and routine process for the selected function block; executing an antenna effect suppressing process for the selected function block; executing a timing verification process for the selected function block; executing a design rule check process for the selected function block; and repeating the antenna effect suppressing process until it is verified that all of the function blocks have been subjected to the antenna effect suppressing process, and wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and connecting the gate-connected one to an adjacent one of plural divided sub-interconnection parts through additional inter-layer contacts and a higher level additional interconnection than the plural divided sub-interconnection parts.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is further preferable that the computer program includes an antenna effect suppressing process which further comprising the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and inserting at least a buffer between the gate-connected one to an adjacent one of plural divided sub-interconnection parts.

It is further preferable that the buffer comprises a logic gate.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

It is further preferable that the computer program comprises the step of: executing a placement and routine process; executing an antenna effect suppressing process; executing a timing verification process; and executing a design rule check process, wherein the antenna effect suppressing process further comprises the steps of: extracting an interconnection which has an area exceeding the predetermined reference value and the interconnection being connected to the gate electrode and not connected to the diffusion region, when the each interconnection is patterned; dividing the extracted interconnection into plural divided sub-interconnection parts, so that a gate-connected one of the plural divided sub-interconnection parts is connected to the gate electrode and the gate connected one of the plural divided sub-interconnection parts has an area which does not exceed the predetermined reference value; and inserting at least a buffer between the gate-connected one to an adjacent one of plural divided sub-interconnection parts.

It is further preferable that the buffer comprises a logic gate.

It is further preferable that the extracting process further comprises the steps of: calculating individual areas of all interconnections constituting the multilevel interconnections; calculating individual total values of areas the same level interconnections for all level; verifying that each of the individual total values of areas exceeds a predetermined level reference value; extracting an interconnection being connected to the gate electrode from the same level interconnections having the larger total value of areas; verifying that an area of the extracted interconnection exceeds the predetermined reference value; and verifying that the extracted interconnection is not connected to the diffusion region, when the interconnection is patterned.

It is further preferable that the dividing process further comprises the steps of: dividing the extracted interconnection into first and second divided sub-interconnection parts, so that the first divided sub-interconnection part is connected to the gate electrode and the second divided sub-interconnection part is not connected to the gate electrode, so that the first divided sub-interconnection part has an area which does not exceed the predetermined reference value.

The third present invention provides a semiconductor device having at least a field effect transistor having a gate electrode and at least a route comprising multilevel interconnections, and the route extending between a diffusion region and the gate electrode, wherein each interconnection has an area which does not exceed a predetermined reference value, provided that the each interconnection is connected to the gate electrode without intervening any higher level inter-layer contact and any higher level interconnection than the each interconnection and further without intervening any buffer, and that the each interconnection is connected to the diffusion region through at least any one of a buffer, a higher level inter-layer contact and a higher level interconnection than the each interconnection.

It is further preferable that the buffer comprises a logic gate.

PREFERRED EMBODIMENT

DESCRIPTION OF THE PREFERRED EMBODIMENTS

Figure 8:
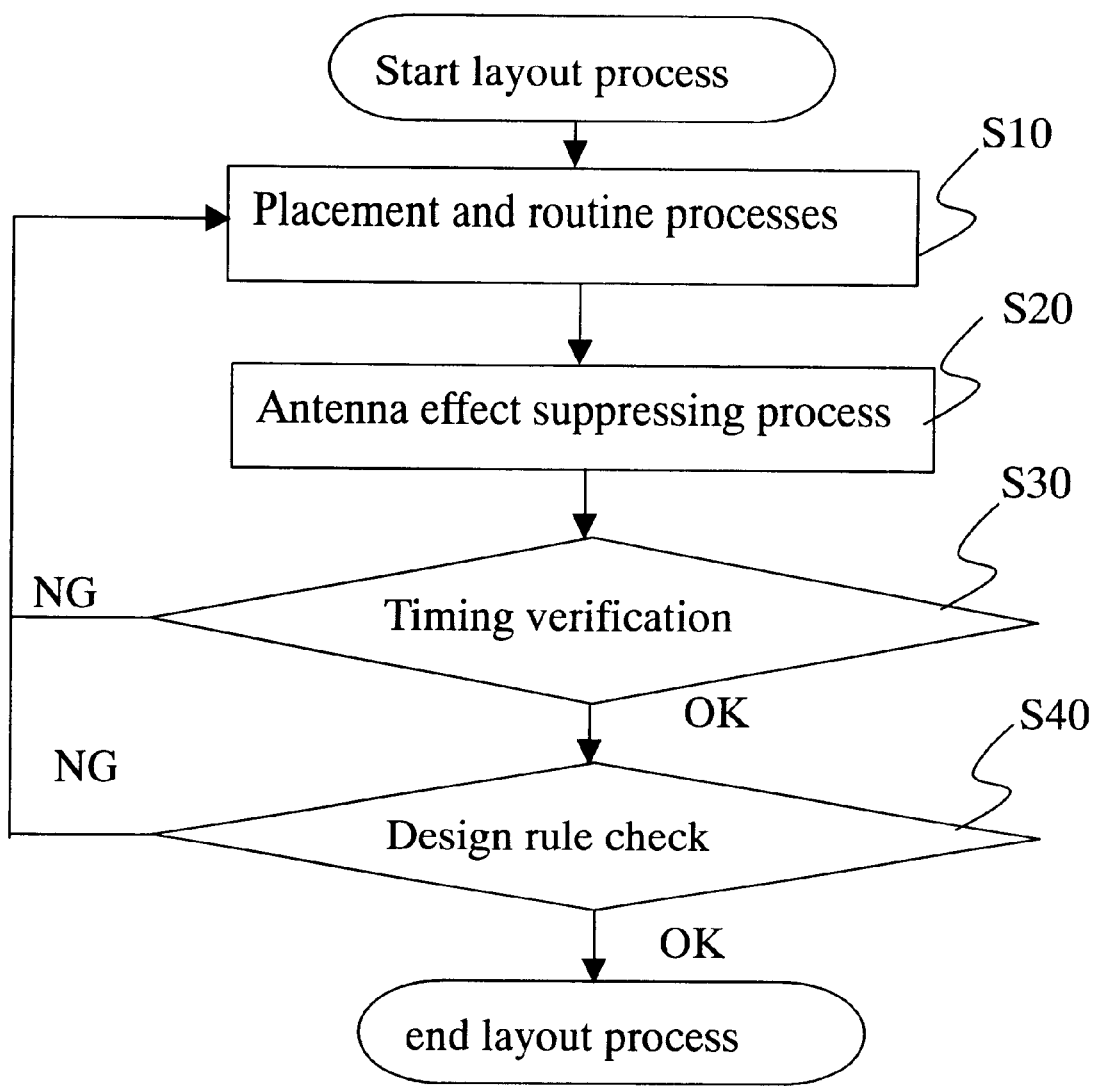
FIG. 8 is a flow chart illustrative of a novel layout design method in a first embodiment in accordance with the present invention.
Figure 9:
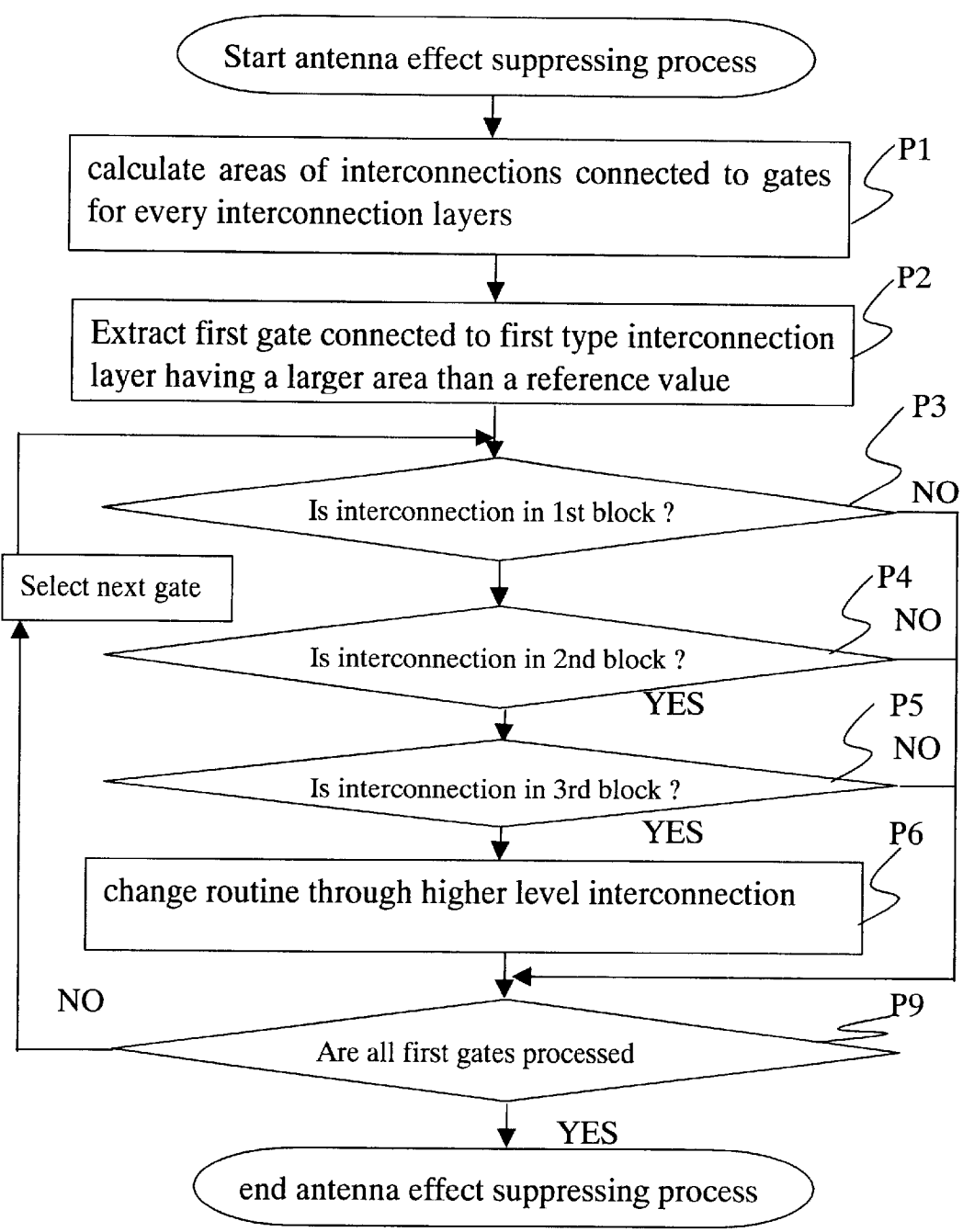
FIG. 9 is a flow chart illustrative of a novel countermeasure process for suppressing the antenna effect involved in the novel layout design method in a first embodiment in accordance with the present invention.

A first embodiment according to the present invention will be described in detail with reference to FIGS. 8–10.

The novel layout design method comprises the following steps. In a first step S10, a placement and routine process is executed on the basis of the given circuit informations to prepare a first layout information. In a second step S20, an antenna effect suppressing process is executed to prepare a second layout information by correcting the first layout information, wherein the correction is so executed that an area of an interconnection pattern does not exceed the predetermined reference value. The interconnection pattern is to be formed as an interconnection which has a first end connected to a gate of a first field effect transistor and a second end which has not yet been connected indirectly to a diffusion region formed in a semiconductor substrate and distanced from the first field effect transistor, even the second end of the interconnection will in the future be connected indirectly to the diffusion region formed in the semiconductor substrate until the multilevel interconnection is completed. This antenna effect suppressing process will again be described below in detail with reference to FIG. 9. In a third step S30, a timing check process is executed for conducting a timing verification on the basis of the second layout information prepared in the above antenna effect suppressing process. In a fourth step, a design rule check is executed on the basis of the second layout information.

If the multilevel interconnection structure has not less than three levels. The antenna effect suppressing process comprises the following steps.

In a first step P1, from the first layout information prepared by the placement and routine process, an area of each metal interconnection layer is calculated, wherein the metal interconnection layer has a first end connected to the gate of the field effect transistor and a second end connected to the diffusion region in the semiconductor substrate. This calculation is made for all of the above metal interconnections layers.

In a second step P2, an extraction is executed for the first type gate electrodes connected to the first ends of the first type interconnection layers having an individual area which exceeds the predetermined reference value.

In a third step P3, it is verified that first type gate contact layers connecting the first end of the first type interconnections to the gate electrodes have been formed when the first type interconnections have been patterned.

In a fourth step P4, if the first type gate contact layers have been formed, then it is verified whether or not the area of the first type gate contact layers exceeds the predetermined reference value, and the first type interconnections connected to the first type gate contact layers having the areas exceeding the predetermined reference value are so called to as the second type interconnections.

In a fifth step P5, if the second type interconnections are present, then it is verified whether or not the second ends of the second type interconnections have not yet been connected to the diffusion regions and in the floating state from the diffusion region, when the first type interconnection layers are patterned by the plasma etching process to form the second type interconnections. The second type interconnections having the second ends having not yet been connected to the diffusion regions and in the floating state from the diffusion region will be referred to as the third type interconnections.

In a sixth step P6, if the third interconnections are present, then the interconnection pattern is changed so that the first gate electrode and the first end of the third type interconnection are connected to each other through an upper level interconnection.

Figure 10:
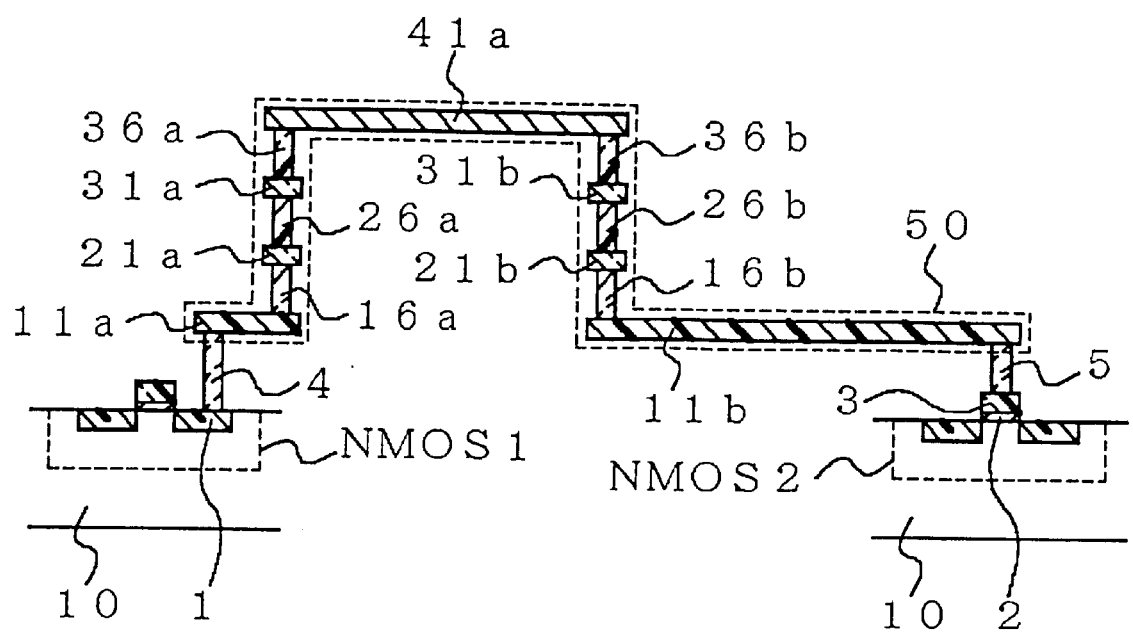
FIG. 10 is a fragmentary cross sectional elevation view illustrative of a route comprising a multilevel interconnection structure extending between first and second inverters in a semiconductor substrate before the novel countermeasure process for suppressing the antenna effect will be carried out in a first embodiment in accordance with the present invention.
Figure 11:
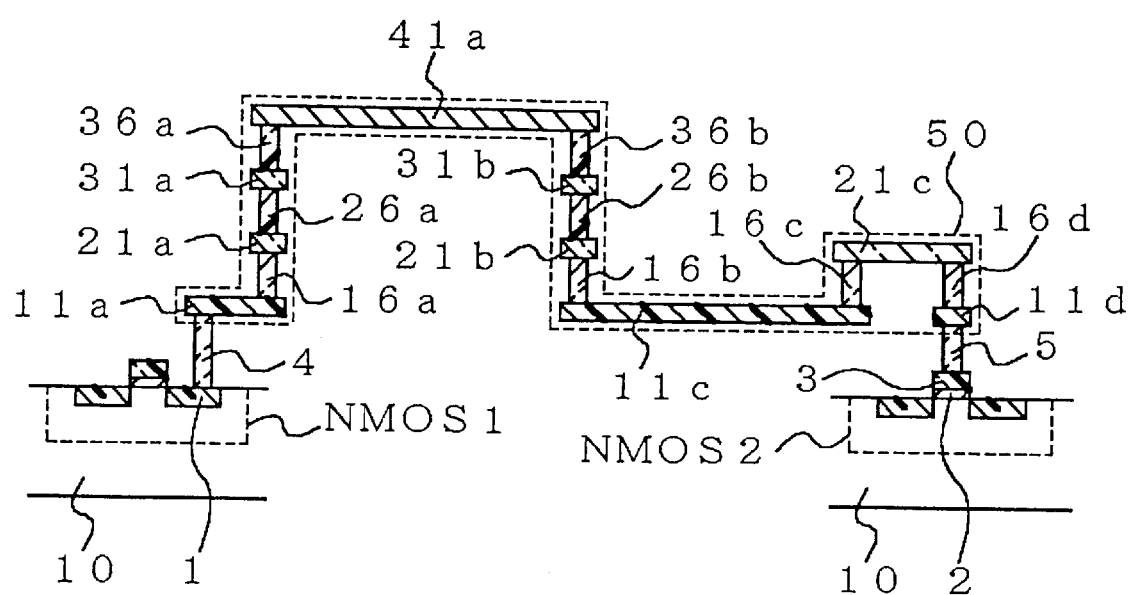
FIG. 11 is a fragmentary cross sectional elevation view illustrative of a route comprising a multilevel interconnection structure extending between first and second inverters in a semiconductor substrate after the novel countermeasure process for suppressing the antenna effect has been carried out in a first embodiment in accordance with the present invention.

With reference to FIGS. 10 and 11, in accordance with the first layout information, the route 50 connecting the first and second inverters INV51 and INV52 comprises a drain diffusion region 1 of the n-channel MOS field effect transistor NMOS1 of the first inverter in the semiconductor substrate 10, a diffusion contact 4, a first level interconnection 11a, a second level contact 16a, a second level interconnection 21a, a third level contact 26a, a third level interconnection 31a, a fourth level contact 36a, a fourth level interconnection 41a, a fourth level contact 36b, a third level interconnection 31b, a third level contact 26b, a second level interconnection 21b, a second level contact 16b and a first level interconnection 11b and a gate contact 5 connected to a gate electrode 3 over a gate insulating film 2 of an n-channel MOS field effect transistor NMOS2 of the second inverter in the semiconductor substrate 10.

The antenna effect suppressing process comprises the following steps.

In a first step P1, individual areas of all of the interconnections included in the route 50 are calculated. For example, individual areas are calculated of the first level interconnections 11a and 11b, the second level interconnections 21a and 21b, the third level interconnections 31a and 31b, the fourth level interconnection 41a. Further, the sum of the areas of the same level interconnection is calculated for each level. Namely, a first level area of the sum of the areas of the first level interconnections 11a and 11b is calculated. A second level area of the sum of the areas of the second level interconnections 21a and 21b is calculated. A third level area of the sum of the areas of the third level interconnections 31a and 31b is calculated. A fourth level area of the sum of the area of the fourth level interconnection 41a is calculated. It is assumed that the area of the first level interconnection 11b exceeds the predetermined reference value, then the first level area of the sum of the areas of the first level interconnections 11a and 11b exceeds the predetermined level reference value.

In a first step P2, the gate electrodes 3 of the n-channel MOS field effect transistor NMOS2 and the p-channel MOS field effect transistor PMOS2 are extracted as the gate electrodes connected to the interconnection involved in the first level interconnection layer having the first level area which exceeds the predetermined level reference value.

In a first step P3, it is verified whether or not any interconnection included in the first level interconnection layer and being connected to the gate electrode is present. Since the first level interconnection 11b is connected to the gate electrode, then the first level interconnection 11b is extracted.

In a first step P4, it is verified whether or not the area of the extracted first level interconnection 11b exceeds the predetermined reference value. It is confirmed that the area of the extracted first level interconnection 11b exceeds the predetermined reference value.

In a first step P5, it is verified whether or not the extracted first level interconnection 11b is connected to any of the diffusion region at a time when the first level interconnection 11b is just formed by patterning the first level interconnection layer in the plasma etching process. It is confirmed that the extracted first level interconnection 11b is not connected to any diffusion region and is floated from all of the diffusion region.

In a sixth step P6, the first level interconnection 11b is divided into two divided interconnections 11c and 11d, wherein the divided interconnection 11d is connected to the gate electrode 3 through the gate contact 5, and the divided interconnection lid has a smaller area than the predetermined reference value. For all of the extracted gate electrodes 3, the above second to sixth processes will be repeated to prepare complete second layout informations, whereby the antenna effect suppressing processes have been completed.

The actual manufacturing processes are carried out in accordance with the second layout informations as shown in FIG. 11. If the large amount of the charges is generated in the first level divided interconnection 11c in the plasma etching process for patterning the first level interconnection layer into the first level interconnections 11a, 11c and 11d, then the first level interconnection 11c is, however, not connected to the gate electrode 3 at this time. Namely, the large amount of the charges does not reach the gate electrode, whereby the breakdown of the gate insulating film the antenna effect can be prevented. Further, the input side of the second inverter INV52 uses only the first and second level interconnections. No third nor fourth level interconnections are used in the input side of the second inverter INV52, for which reason it is unnecessary to do a modified routine to avoid the dividing region, in which the first level interconnection 11b is divided.

The above antenna effect suppressing process results in that all of the gate electrodes are not connected to the interconnections having the larger area than the predetermined reference value and being not connected to any diffusion region when the interconnection is formed by patterning the interconnection layer including the interconnection, whereby the gate is free from the breakdown due to the antenna effect. The routine changing process is made to the selected interconnection only for presenting the antenna effect, for which reason the reduction in freedom in routine of the interconnections is suppressed at minimum.

Figure 12:
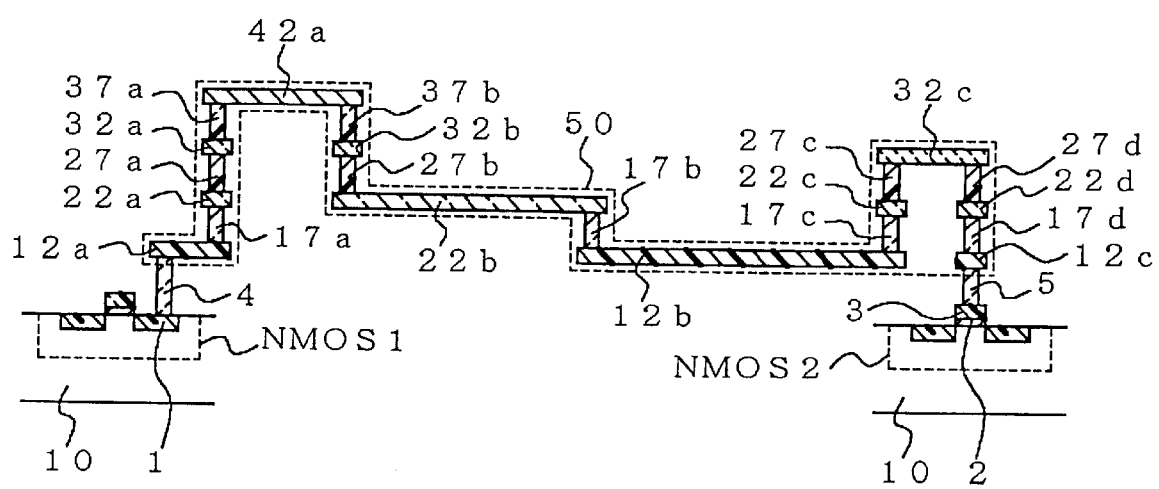
FIG. 12 is a fragmentary cross sectional elevation view illustrative of a route comprising a multilevel interconnection structure extending between first and second inverters in a semiconductor substrate after the other novel countermeasure process for suppressing the antenna effect has been carried out in a first embodiment in accordance with the present invention.

FIG. 12 is a fragmentary cross sectional elevation view illustrative of a route comprising a multilevel interconnection structure extending between first and second inverters in a semiconductor substrate after the other novel countermeasure process for suppressing the antenna effect has been carried out. Before the antenna effect suppressing process is carried out, the interconnection 12b having the larger area than the predetermined reference value is connected to the gate electrode 3 and not connected to the diffusion region 1. It is possible that the breakdown of the gate insulating film 2 under the gate electrode 3 is caused by the antenna effect, for which reason the antenna effect suppressing process is carried out to the first level interconnection 12b, whereby the first level interconnection 12b is divided into the divided first level interconnection 12b and a divided first level interconnection 12c, wherein the divided first level interconnection 12b is not connected to the gate electrode 3, whilst the divided first level interconnection 12c is connected to the gate electrode and has a smaller area than the predetermined reference value. The route 50 is changed by the antenna effect suppressing process, so that the divided first level interconnection 12b and the divided first level interconnection 12c are connected to each other through the third level interconnection 32c, whereby the antenna effect suppressing processes have been completed.

The actual manufacturing processes are carried out in accordance with the second layout informations. If the large amount of the charges is generated in the first level divided interconnection 12b in the plasma etching process for patterning the first level interconnection layer into the first level interconnections 12a, 12b and 12c, then the first level interconnection 12b is, however, not connected to the gate electrode 3 at this time. Namely, the large amount of the charges does not reach the gate electrode, whereby the breakdown of the gate insulating film the antenna effect can be prevented. Further, the input side of the second inverter INV52 uses only the first and second level interconnections. No fourth level interconnections are used in the input side of the second inverter INV52, for which reason it is unnecessary to do a modified routine to avoid the dividing region, in which the first level interconnection 12b is divided.

The above antenna effect suppressing process results in that all of the gate electrodes are not connected to the interconnections having the larger area than the predetermined reference value and being not connected to any diffusion region when the interconnection is formed by patterning the interconnection layer including the interconnection, whereby the gate is free from the breakdown due to the antenna effect. The routine changing process is made to the selected interconnection only for presenting the antenna effect, for which reason the reduction in freedom in routine of the interconnections is suppressed at minimum.

The above change in interconnection pattern for suppressing the antenna effect may be carried out by manual corrections using layout editor.

In accordance with the above novel layout design method, the just one high level short interconnection is used to divide the problem interconnection for preventing the antenna effect, whereby the reduction in freedom of routine of the interconnections is suppressed at minimum. As compared to the conventional countermeasure using the top level interconnection in a primitive unit, the above novel method allows the high freedom of routine of interconnections and high degree of integration and makes it easy to carry out the timing design.

Figure 13:
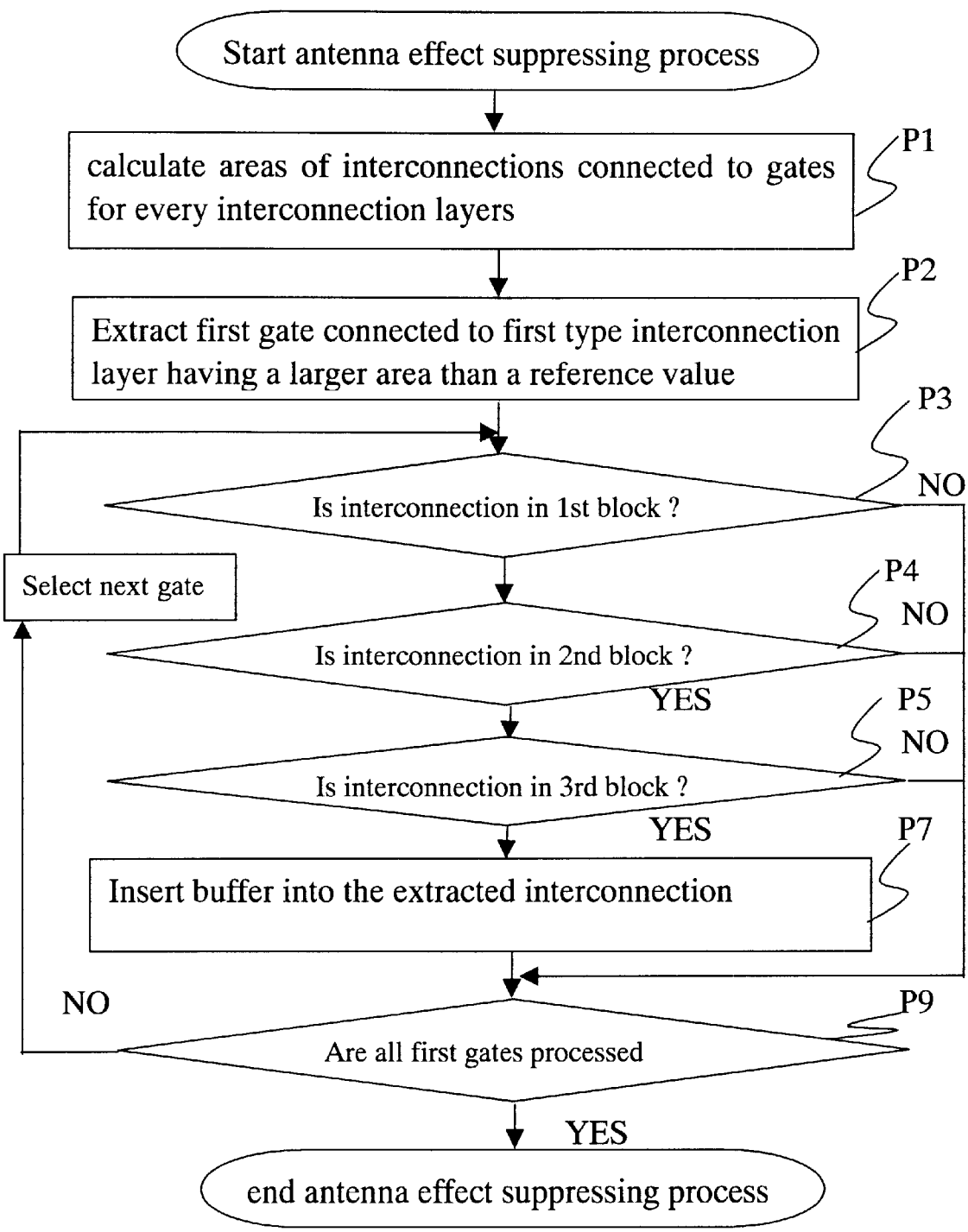
FIG. 13 is a flow chart illustrative of a novel countermeasure process for suppressing the antenna effect involved in the novel layout design method in a second embodiment in accordance with the present invention.

A second embodiment according to the present invention will be described in detail with reference to FIGS. 13–15.

If the multilevel interconnection structure has not less than three levels. The antenna effect suppressing process comprises the following steps.

In a first step P1, from the first layout information prepared by the placement and routine process, an area of each metal interconnection layer is calculated, wherein the metal interconnection layer has a first end connected to the gate of the field effect transistor and a second end connected to the diffusion region in the semiconductor substrate. This calculation is made for all of the above metal interconnections layers.

In a second step P2, an extraction is executed for the first type gate electrodes connected to the first ends of the first type interconnection layers having an individual area which exceeds the predetermined reference value.

In a third step S3, it is verified that first type gate contact layers connecting the first end of the first type interconnections to the gate electrodes have been formed when the first type interconnections have been patterned.

In a fourth step P4, if the first type gate contact layers have been formed, then it is verified whether or not the area of the first type gate contact layers exceeds the predetermined reference value, and the first type interconnections connected to the first type gate contact layers having the areas exceeding the predetermined reference value are so called to as the second type interconnections.

In a fifth step P5, if the second type interconnections are present, then it is verified whether or not the second ends of the second type interconnections have not yet been connected to the diffusion regions and in the floating state from the diffusion region, when the first type interconnection layers are patterned by the plasma etching process to form the second type interconnections. The second type interconnections having the second ends having not yet been connected to the diffusion regions and in the floating state from the diffusion region will be referred to as the third type interconnections.

In a sixth step P7, if the third interconnections are present, then a buffer is inserted into the third interconnection for dividing the third interconnection into two parts, so that the divided part connected to the gate electrode has a smaller area than the predetermined reference value.

A difference of the second embodiment from the first embodiment is in that the third interconnection being connected to the gate electrode and having the area larger than the predetermined reference value is divided by the buffer into the two parts, so that the part connected to the gate electrode has a smaller area than the predetermined reference value. Namely, the divided two parts of the third type interconnection is connected through the buffer in place of the higher level interconnection.

Figure 14:
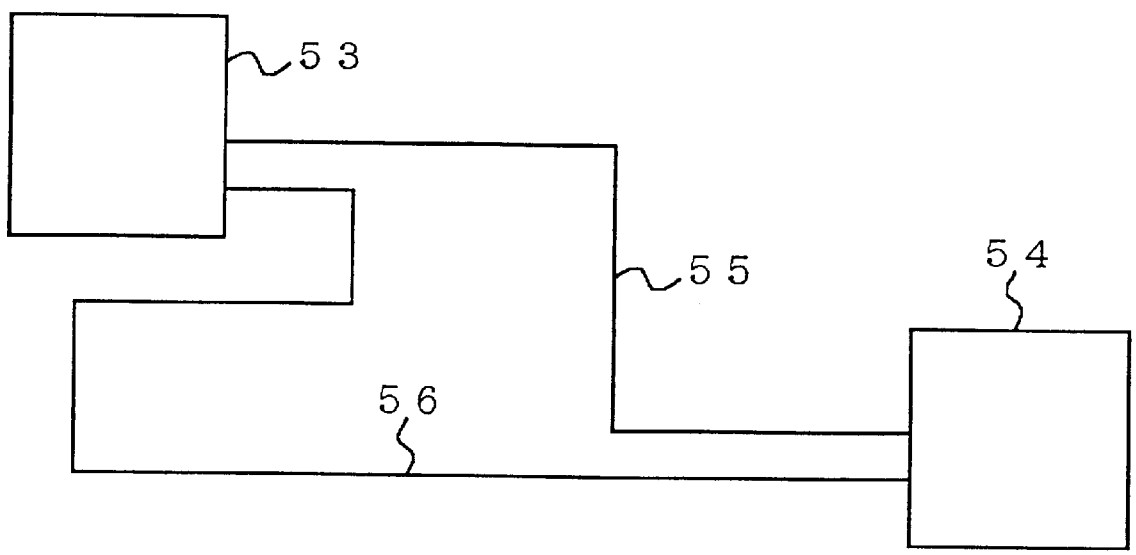
FIG. 14 is a fragmentary cross sectional elevation view illustrative of a route comprising a multilevel interconnection structure extending between first and second inverters in a semiconductor substrate before the novel countermeasure process for suppressing the antenna effect will be carried out in a second embodiment in accordance with the present invention.
Figure 15:
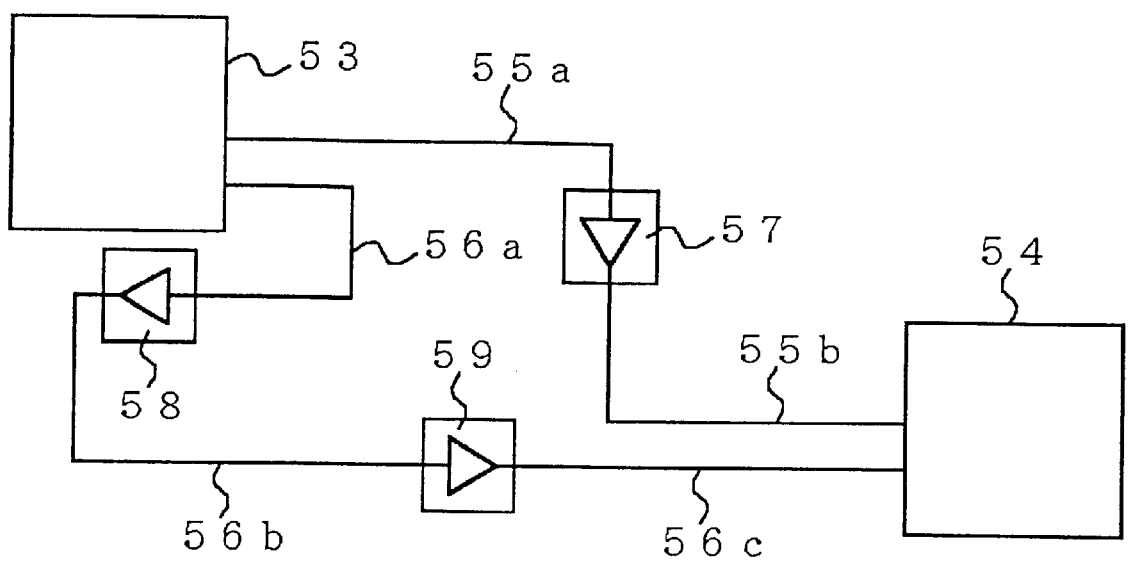
FIG. 15 is a fragmentary cross sectional elevation view illustrative of a route comprising a multilevel interconnection structure extending between first and second inverters in a semiconductor substrate after the novel countermeasure process for suppressing the antenna effect has been carried out in a second embodiment in accordance with the present invention.

With reference to FIGS. 14 and 15, in accordance with the first layout information, the routes 55 and 56 are present, which connect the first and second function blocks 53 and 54. After the above antenna effect suppressing process has been carried out, a buffer 57 is inserted into the route 55 so that the route 55 is divided by the buffer 57 into two sub-routes 55a and 55b. Further, two buffers 58 and 59 are inserted into the route 56 so that the route 56 is divided by the two buffers 58 and 59 into three sub-routes 56a, 56b and 56c. The all of the divided sub-routes having the smaller areas than the predetermined reference values, whereby the antenna effect can be suppressed.

The above antenna effect suppressing process results in that all of the gate electrodes are not connected to the interconnections having the larger area than the predetermined reference value and being not connected to any diffusion region when the interconnection is formed by patterning the interconnection layer including the interconnection, whereby the gate is free from the breakdown due to the antenna effect. The buffer insertion process is made without forming any higher level additional interconnection, for which reason no reduction in freedom in routine of the interconnections is caused.

The above insertion of the buffers for suppressing the antenna effect may be carried out by inserting buffers into the connecting informations to change the circuit informations, and a local automatic layout may be carried out to the changed part.

In accordance with the above novel layout design method, the just one high level short interconnection is used to divide the problem interconnection for preventing the antenna effect, whereby the reduction in freedom of routine of the interconnections is suppressed at minimum. As compared to the conventional countermeasure using the top level interconnection in a primitive unit, the above novel method allows the high freedom of routine of interconnections and high degree of integration and makes it easy to carry out the timing design.

Figure 16:
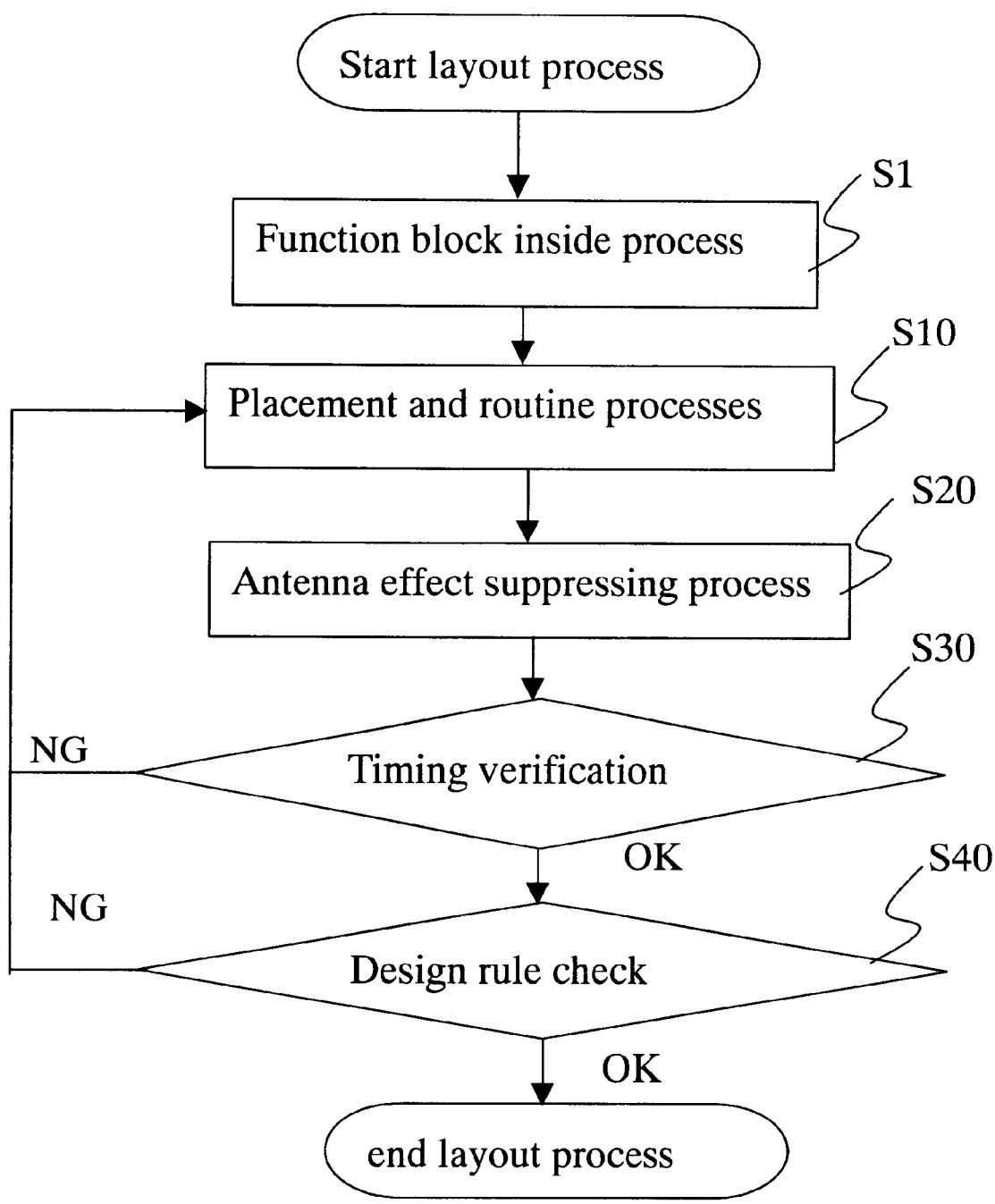
FIG. 16 is a flow chart illustrative of a novel layout design method in a third embodiment in accordance with the present invention.
Figure 17:
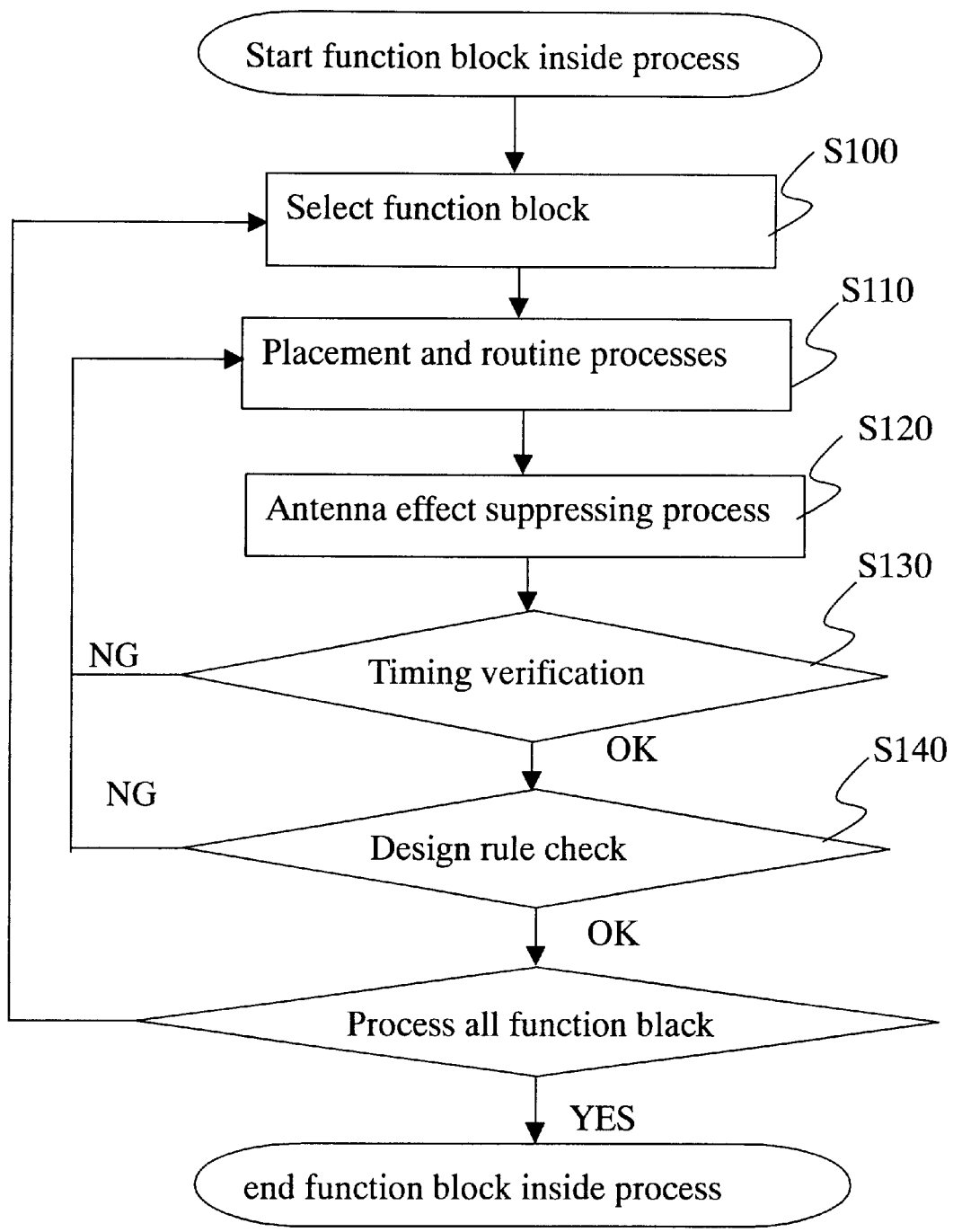
FIG. 17 is a flow chart illustrative of function block processes involved in the novel layout design method in a first embodiment in accordance with the present invention.
Figure 18:
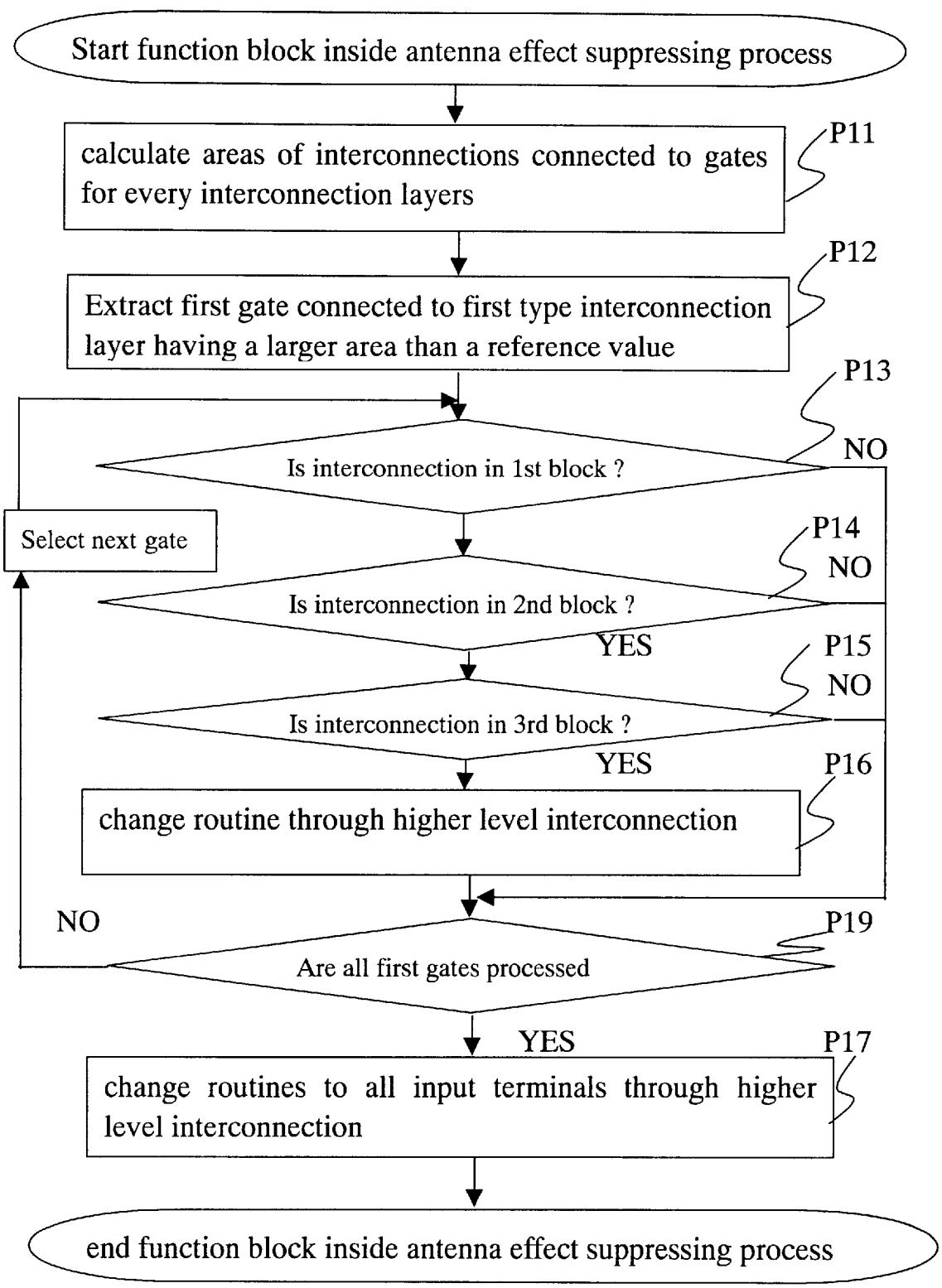
FIG. 18 is a flow chart illustrative of a novel countermeasure process for suppressing the antenna effect involved in function block processes involved in the novel layout design method in a first embodiment in accordance with the present invention.

A third embodiment according to the present invention will be described in detail with reference to FIGS. 16–18.

The novel layout design method comprises the following steps. The semiconductor device has plural function blocks, each of which has plural gate circuits. In a first step S1, a function block inside layout process is carried out for extracting plural function blocks from the given circuit information to prepare function block inside layout information. In a second step S10, a placement and routine process is executed on the basis of the given circuit informations to prepare a first layout information. In a third step S20, an antenna effect suppressing process is executed to prepare a second layout information by correcting the first layout information, wherein the correction is so executed that an area of an interconnection pattern does not exceed the predetermined reference value. The interconnection pattern is to be formed as an interconnection which has a first end connected to a gate of a first field effect transistor and a second end which has not yet been connected indirectly to a diffusion region formed in a semiconductor substrate and distanced from the first field effect transistor, even the second end of the interconnection will in the future be connected indirectly to the diffusion region formed in the semiconductor substrate until the multilevel interconnection is completed. This antenna effect suppressing process will again be described below in detail with reference to FIG. 18. In a fourth step S30, a timing check process is executed for conducting a timing verification on the basis of the second layout information prepared in the above antenna effect suppressing process. In a fifth step 40, a design rule check is executed on the basis of the second layout information.

The above block inside process S1 further comprises the following steps.

In a first step S100, function blocks are selected.

In a second step S110, a placement and routine process is executed on the basis of the given circuit informations to prepare a first layout information.

In a third step S120, an antenna effect suppressing process is executed to prepare a second layout information by correcting the first layout information, wherein the correction is so executed that an area of an interconnection pattern does not exceed the predetermined reference value. The interconnection pattern is to be formed as an interconnection which has a first end connected to a gate of a first field effect transistor and a second end which has not yet been connected indirectly to a diffusion region formed in a semiconductor substrate and distanced from the first field effect transistor, even the second end of the interconnection will in the future be connected indirectly to the diffusion region formed in the semiconductor substrate until the multilevel interconnection is completed. This antenna effect suppressing process will again be described below in detail with reference to FIG. 18.

In a fourth step S130, a timing check process is executed for conducting a timing verification on the basis of the second layout information prepared in the above antenna effect suppressing process.

In a fifth step 140, a design rule check is executed on the basis of the second layout information.

In a sixth step S150, it is verified that all of the function blocks have been subjected to the above processes.

The functional block inside antenna effect suppressing process comprises the following steps. In a first step P11, from the function block inside layout information prepared by the placement and routine process, an area of each metal interconnection layer is calculated, wherein the metal interconnection layer has a first end connected to the gate of the field effect transistor and a second end connected to the diffusion region in the semiconductor substrate. This calculation is made for all of the gate electrodes.

In a second step P12, an extraction is executed for the first type gate electrodes connected to the first ends of the first type interconnection layers having an individual area which exceeds the predetermined reference value.

In a third step P13, it is verified that first type gate contact layers connecting the first end of the first type interconnections to the gate electrodes have been formed when the first type interconnections have been patterned.

In a fourth step P14, if the first type gate contact layers have been formed, then it is verified whether or not the area of the first type gate contact layers exceeds the predetermined reference value, and the first type interconnections connected to the first type gate contact layers having the areas exceeding the predetermined reference value are so called to as the second type interconnections.

In a fifth step P15, if the second type interconnections are present, then it is verified whether or not the second ends of the second type interconnections have not yet been connected to the diffusion regions and in the floating state from the diffusion region, when the first type interconnection layers are patterned by the plasma etching process to form the second type interconnections. The second type interconnections having the second ends having not yet been connected to the diffusion regions and in the floating state from the diffusion region will be referred to as the third type interconnections.

In a sixth step P16, if the third interconnections are present, then the interconnection pattern is changed so that the first gate electrode and the first end of the third type interconnection are connected to each other through an upper level interconnection.

In a seventh step P19, it is verified that the above processes are made to selected one of the function blocks.

In an eighth step P17, an interconnection between the gate electrode and the input terminals in the function block is changed in routine so that an interconnection connected to the gate electrode and an interconnection connected to the input terminal are connected to each other through inter-layer contacts and a higher level interconnection than the above interconnections.

Figure 19:
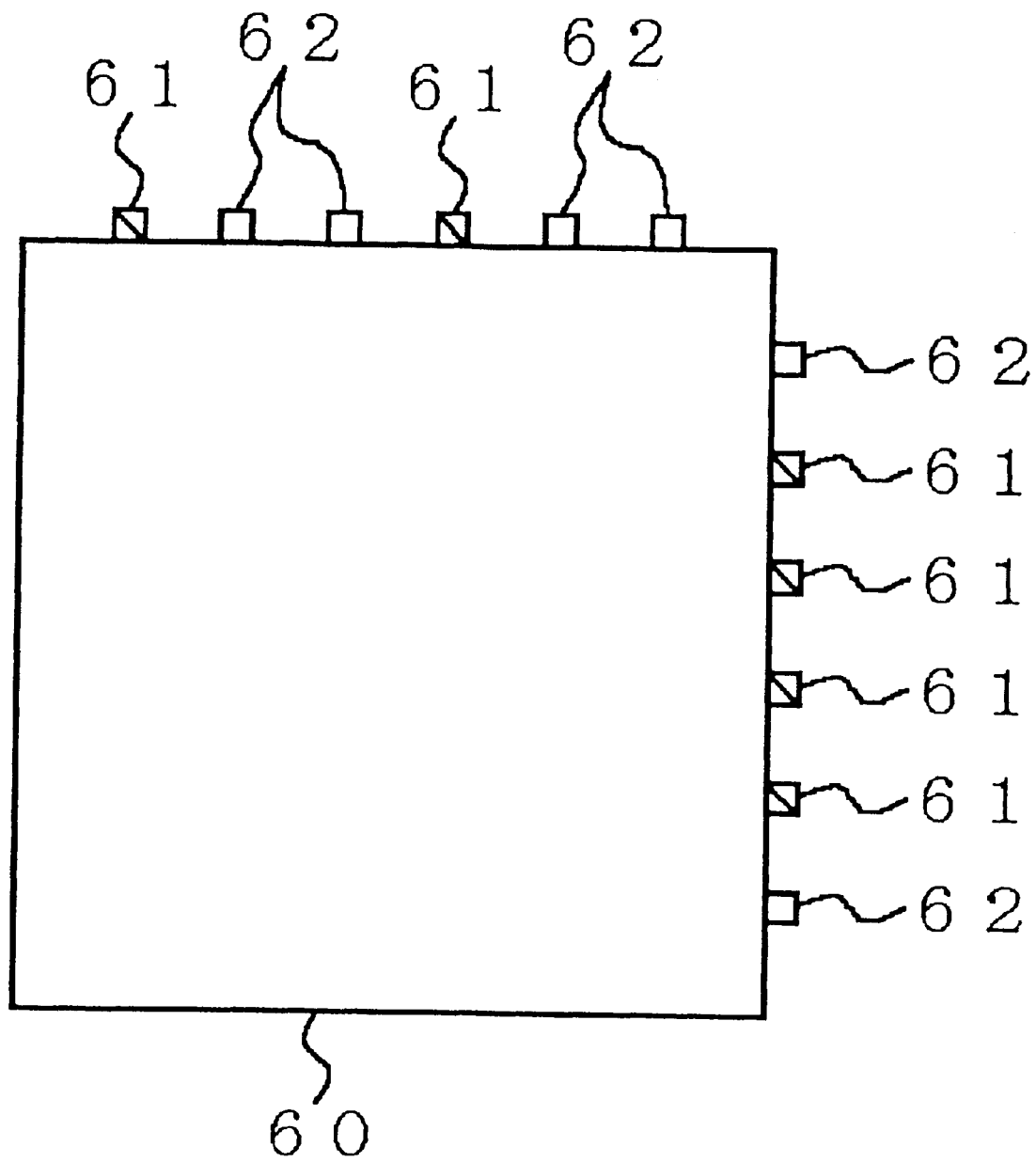
FIG. 19 is a block diagram illustrative of a function block with input terminals.
Figure 20:
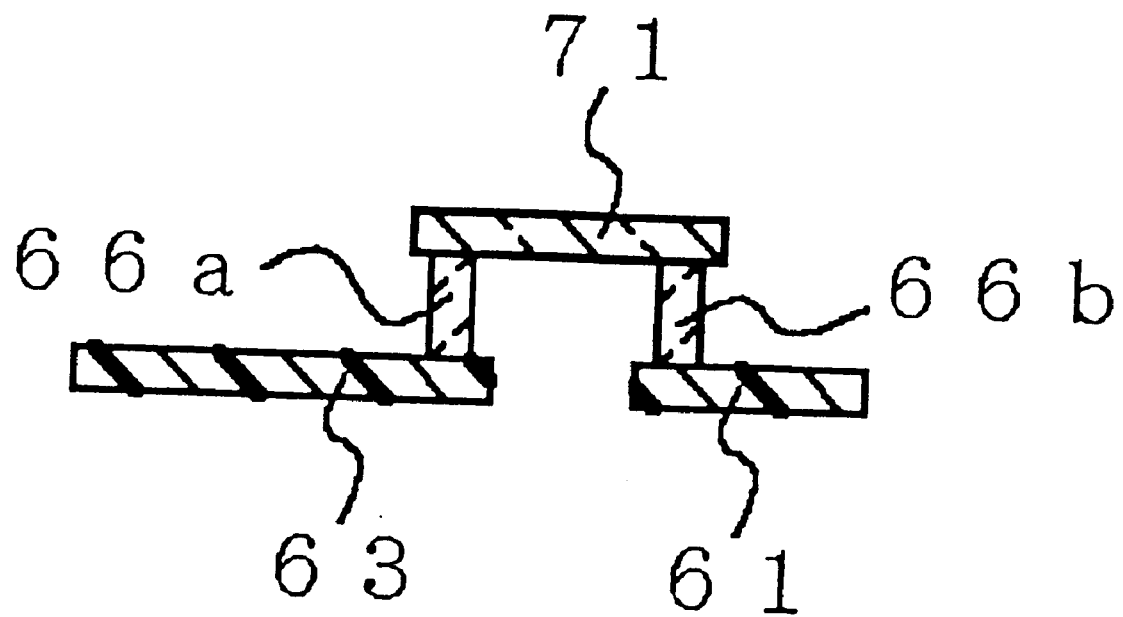
FIG. 20 is a fragmentary cross sectional elevation view illustrative of a input terminal interconnection structure.

FIG. 19 is a block diagram illustrative of a function block with input terminals. FIG. 20 is a fragmentary cross sectional elevation view illustrative of a input terminal interconnection structure. A function block 60 has plural input terminals 61 and output terminals 62. After the internal circuits of the function block 60 have been subjected to the above sequential processes P11 to P16, then the input terminals 61 are subjected to the additional process P17. An interconnection between the gate electrode and the input terminals 61 in the function block 60 is changed in routine so that an interconnection 63 connected to the gate electrode and an interconnection 61 connected to the input terminal 61 are connected to each other through inter-layer contacts 66a and 66b and a higher level interconnection 71 than the interconnections 61 and 63.

In accordance with this embodiment, the function bock inside antenna effect process is carried out to the function block 60, and further an interconnection between the gate electrode and the input terminals 61 in the function block 60 is changed in routine so that an interconnection 63 connected to the gate electrode and an interconnection 61 connected to the input terminal 61 are connected to each other through inter-layer contacts 66a and 66b and a higher level interconnection 71 than the interconnections 61 and 63. As a result, it is possible to prevent the above problem causing the antenna effect in the vicinity of the input terminals of the function block 60.

The above change in interconnection pattern for suppressing the antenna effect may be carried out by manual corrections using layout editor.

In accordance with the above novel layout design method, the just one high level short interconnection is used to divide the problem interconnection for preventing the antenna effect, whereby the reduction in freedom of routine of the interconnections is suppressed at minimum. As compared to the conventional countermeasure using the top level interconnection in a primitive unit, the above novel method allows the high freedom of routine of interconnections and high degree of integration and makes it easy to carry out the timing design.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device having at least a field effect transistor having a gate electrode and at least a route comprising multilevel interconnections, and said route extending between a diffusion region and the gate electrode, wherein each interconnection has an area which does not exceed a predetermined reference value, provided that said each interconnection is connected to said gate electrode without intervening any higher level interlayer contact and any higher level interconnection than said each interconnection and further without intervening any buffer, and that said each interconnection is connected to said diffusion region through a buffer.

2. The semiconductor device as claimed in claim 1, wherein said buffer comprises a logic gate.

3. A method of designing a layout for a semiconductor device that has a diffusion area connected to a gate electrode of a field effect transistor, the method designing a route for an interconnector between the diffusion area and the gate electrode and comprising the steps of:

determining whether the interconnector has an area that exceeds an antenna effect reference value; and when the interconnect has an area that exceeds the antenna effect reference value, adding a buffer to the interconnect to divide the interconnect so that a first portion of the divided interconnect contacting the gate electrode has an area that is less than the antenna effect reference value.

4. The method of claim 3, wherein the determining step comprises the steps of verifying that the interconnector is not to be connected to the diffusion area when the interconnector is patterned, calculating an area of the interconnector at one level of the semiconductor device, comparing the calculated area to the antenna effect reference value, and, when the interconnect has a calculated area that exceeds the antenna effect reference value, selecting a place in the interconnector where the buffer is to be added at the one level to reduce the area of the first portion to less than the antenna effect reference value.

5. The method of claim 3, wherein the step of adding a buffer comprises adding a logic gate to the interconnect to separate the first portion from a second portion thereof.

6. A computer program for designing a layout for a semiconductor device that has a diffusion area connected to a gate electrode of a field effect transistor, the program designing a route for an interconnector between the diffusion area and the gate electrode and performing the steps of:

determining whether the interconnector has an area that exceeds an antenna effect reference value; and when the interconnect has an area that exceeds the antenna effect reference value, adding a buffer to the interconnect to divide the interconnect so that a first portion of the divided interconnect contacting the gate electrode has an area that is less than the antenna effect reference value.

7. The program of claim 6, wherein the program performs the determining step by verifying that the interconnector is not to be connected to the diffusion area when the interconnector is patterned, calculating an area of the interconnector at one level of the semiconductor device, comparing the calculated area to the antenna effect reference value, and, when the interconnect has a calculated area that exceeds the antenna effect reference value, selecting a place in the interconnector where the buffer is to be added at the one level to reduce the area of the first portion to less than the antenna effect reference value.

8. A semiconductor device comprising:

a diffusion area connected to a gate electrode of a field effect transistor by an interconnector that extends between the diffusion area and the gate electrode;

said interconnector having a first portion at a first level that is connected to said gate electrode, said first portion having an area that does not exceed an antenna effect reference value, said interconnector also having a second portion connected to said diffusion area;

a buffer at said first level connecting said first portion to said second portion.

9. The device of claim 8, wherein said buffer comprises a logic gate.

10. The device of claim 8, wherein an entirety of said interconnector is at said first level.

* * * * *